United States Patent
Wells et al.

(10) Patent No.: US 7,127,697 B1
(45) Date of Patent: Oct. 24, 2006

(54) METHODS OF UTILIZING PROGRAMMABLE LOGIC DEVICES HAVING LOCALIZED DEFECTS IN APPLICATION-SPECIFIC PRODUCTS

(75) Inventors: Robert W. Wells, Cupertino, CA (US); Robert D. Patrie, Scotts Valley, CA (US); Andrew J. DeBaets, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 407 days.

(21) Appl. No.: 10/631,461

(22) Filed: Jul. 30, 2003

Related U.S. Application Data

(63) Continuation-in-part of application No. 10/388,000, filed on Mar. 12, 2003, which is a continuation-in-part of application No. 10/104,324, filed on Mar. 22, 2002, now Pat. No. 6,817,006, which is a continuation-in-part of application No. 09/924,365, filed on Aug. 7, 2001, now Pat. No. 6,664,808.

(51) Int. Cl.
*G06F 17/50* (2006.01)

(52) U.S. Cl. .............................. 716/16; 716/4

(58) Field of Classification Search ............... 716/4–5, 716/16–17; 714/725; 326/41
See application file for complete search history.

(56) References Cited

U.S. PATENT DOCUMENTS

| | | | |
|---|---|---|---|
| 3,995,261 A | 11/1976 | Goldberg | |
| 4,020,469 A | 4/1977 | Manning | |
| 4,700,187 A | 10/1987 | Furtek | |
| 4,899,067 A | 2/1990 | So et al. | |
| 5,430,734 A * | 7/1995 | Gilson ........................ | 714/725 |
| 5,459,342 A | 10/1995 | Nogami et al. | |
| 5,485,102 A | 1/1996 | Cliff et al. | |
| 5,498,975 A | 3/1996 | Cliff et al. | |
| 5,592,102 A | 1/1997 | Lane et al. | |
| 5,777,887 A | 7/1998 | Marple et al. | |
| 5,889,413 A | 3/1999 | Bauer | |
| 5,914,616 A | 6/1999 | Young et al. | |
| 6,044,025 A * | 3/2000 | Lawman ..................... | 365/191 |
| 6,075,418 A | 6/2000 | Kingsley et al. | |
| 6,128,214 A | 10/2000 | Kuckes et al. | |
| 6,166,559 A | 12/2000 | McClintock et al. | |
| 6,167,558 A | 12/2000 | Trimberger | |
| 6,215,327 B1 * | 4/2001 | Lyke .......................... | 326/41 |
| 6,232,845 B1 | 5/2001 | Kingsley et al. | |
| 6,256,767 B1 | 7/2001 | Kuckes et al. | |

(Continued)

OTHER PUBLICATIONS

U.S. Appl. No. 08/786,818, filed Jan. 27, 1997, Chapman et al.

(Continued)

*Primary Examiner*—Paul Dinh
(74) *Attorney, Agent, or Firm*—Lois D. Cartier; Kim Kanzaki

(57) ABSTRACT

Methods of utilizing partially defective PLDs, i.e., PLDs having localized defects. A partially defective PLD is tested for compatibility with a particular configuration bitstream. If the partially defective PLD is compatible with the bitstream (i.e., if the localized defect has no effect on the functionality of the design implemented by the bitstream), a product is made available that includes both the bitstream and the partially defective PLD. In some embodiments, the bitstream is stored in a memory device such as a programmable read-only memory (PROM). In some embodiments, the product is a chip set that includes the partially defective PLD and a separately-packaged PROM in which the bitstream has previously been stored. In some embodiments, the PROM is manufactured as part of the FPGA die.

14 Claims, 1 Drawing Sheet

U.S. PATENT DOCUMENTS

| | | |
|---|---|---|
| 6,314,019 B1 | 11/2001 | Kuckes et al. |
| 6,344,755 B1 | 2/2002 | Reddy et al. |
| 6,356,514 B1 | 3/2002 | Wells et al. |
| 6,427,156 B1 | 7/2002 | Chapman et al. |
| 6,432,740 B1 | 8/2002 | Chen |
| 6,459,095 B1 | 10/2002 | Heath et al. |
| 6,651,225 B1 | 11/2003 | Lin et al. |

OTHER PUBLICATIONS

U.S. Appl. No. 09/837,380, filed Apr. 17, 2001, Wells et al.
U.S. Appl. No. 09/924,365, filed Aug. 7, 2001, Ling et al.
U.S. Appl. No. 10/199,535, filed Jul. 18, 2002, Trimberger.
U.S. Appl. No. 10/104,324, filed Mar. 22, 2002, Wells et al.

John Emmert et al.; "Dynamic Fault Tolerance in FPGAs via Partial Reconfiguration"; Annual IEEE Symposium on Field-Programmable Custom Computing Machines; Apr. 17, 2000; pp. 165-174.

John M. Emmert et al.; "Incremental Routing in FPGAs"; ASIC Conference 1998. Proceedings, Eleventh Annual IEEE International; Rochester, NY; Sep. 13-16, 1998; pp. 217-221.

Xilinx, Inc., Virtex-II 1.5V Field-Programmable Gate Arrays, Nov. 29, 2001, DS031-2 (v1.9), available from Xilinx, Inc. 2100 Logic Drive, San Jose, CA., 95124, pp. 1-39.

Michael J. S. Smith, "Application-Specific Integrated Circuits" 1997, Ch. 14, available from Addison Wesley Longman, Inc. 75 Arlington Street, Suite 300, Boston, MA 02116, pp. 711-804.

\* cited by examiner

METHODS OF UTILIZING PROGRAMMABLE LOGIC DEVICES HAVING LOCALIZED DEFECTS IN APPLICATION-SPECIFIC PRODUCTS

FIELD OF THE INVENTION

The present invention relates to programmable logic devices (PLDs). More particularly, the invention relates to methods of utilizing PLDs having localized defects in application-specific standard products.

BACKGROUND OF THE INVENTION

Programmable logic devices (PLDs), such as field-programmable gate arrays (FPGAs), are user-programmable integrated circuits that can be programmed to implement user-defined logic functions. In a typical architecture, an FPGA includes an array of configurable logic blocks (CLBs) surrounded by programmable input/output blocks (IOBs). A hierarchy of programmable routing resources interconnects the CLBs and IOBs. Loading a configuration bitstream into configuration memory cells of the FPGA customizes these CLBs, IOBs, and programmable routing resources. Additional resources, such as multipliers, memory, and application-specific circuits can also be included.

PLDs are growing ever larger as vendors attempt to satisfy customer demand for PLDs capable of performing ever more complex tasks. Unfortunately, as die size increases, so too does the probability of finding a defect on a given die. The process yield therefore decreases with PLD complexity, making already expensive PLDs still more expensive.

PLDs are not design specific, but instead afford users (e.g., circuit designers) the ability to instantiate an almost unlimited number of circuit variations. Not knowing in advance the purpose to which a given PLD will be dedicated places a heavy burden on the quality and reliability of the PLD, because PLD vendors must verify the functionality of any feature that might be used. As a result, PLD manufacturers typically discard PLDs that include even relatively minor defects.

PLD defects can be categorized in two general areas: gross defects that render the entire PLD useless or unreliable, and localized defects that damage a relatively small percentage of the PLD. For very large die, a significant percentage of the die can include localized defects. Considering the costs associated with manufacturing large integrated circuits, discarding a significant percentage of PLD die due to localized defects can have a very significant adverse economic impact on PLD manufacturers.

Therefore, it is desirable to provide methods of utilizing PLDs having localized defects.

SUMMARY OF THE INVENTION

The invention provides methods of utilizing partially defective PLDs, i.e., PLDs having localized defects. A partially defective PLD is tested for compatibility with a particular configuration bitstream. If the partially defective PLD is compatible with the bitstream (i.e., if the localized defect has no effect on the functionality of the design implemented by the bitstream), a product is made available that includes both the bitstream and the partially defective PLD. In some embodiments, the bitstream is stored in a memory device such as a programmable read-only memory (PROM). In some embodiments, the product is a chip set that includes the partially defective PLD and a separately-packaged PROM in which the bitstream has previously been stored. In some embodiments, the PROM is manufactured as part of the FPGA die.

According to one embodiment, a method of utilizing a partially defective PLD includes testing for compatibility between the partially defective PLD and a configuration bitstream, and selling, if the partially defective PLD and the configuration bitstream are compatible, a product that includes the partially defective PLD and the configuration bitstream.

According to another embodiment, a method of utilizing a PLD includes testing the PLD for gross defects, discarding the PLD if gross defects are present, and testing the PLD for localized defects. The method also includes, if localized defects are detected, testing for compatibility between the PLD and a configuration bitstream representing a target design, and selling, if the PLD and the configuration bitstream are compatible, a product that includes the PLD and the configuration bitstream.

BRIEF DESCRIPTION OF THE DRAWINGS

The present invention is illustrated by way of example, and not by way of limitation, in the following FIGURE.

DETAILED DESCRIPTION OF THE DRAWINGS

Figure 1:
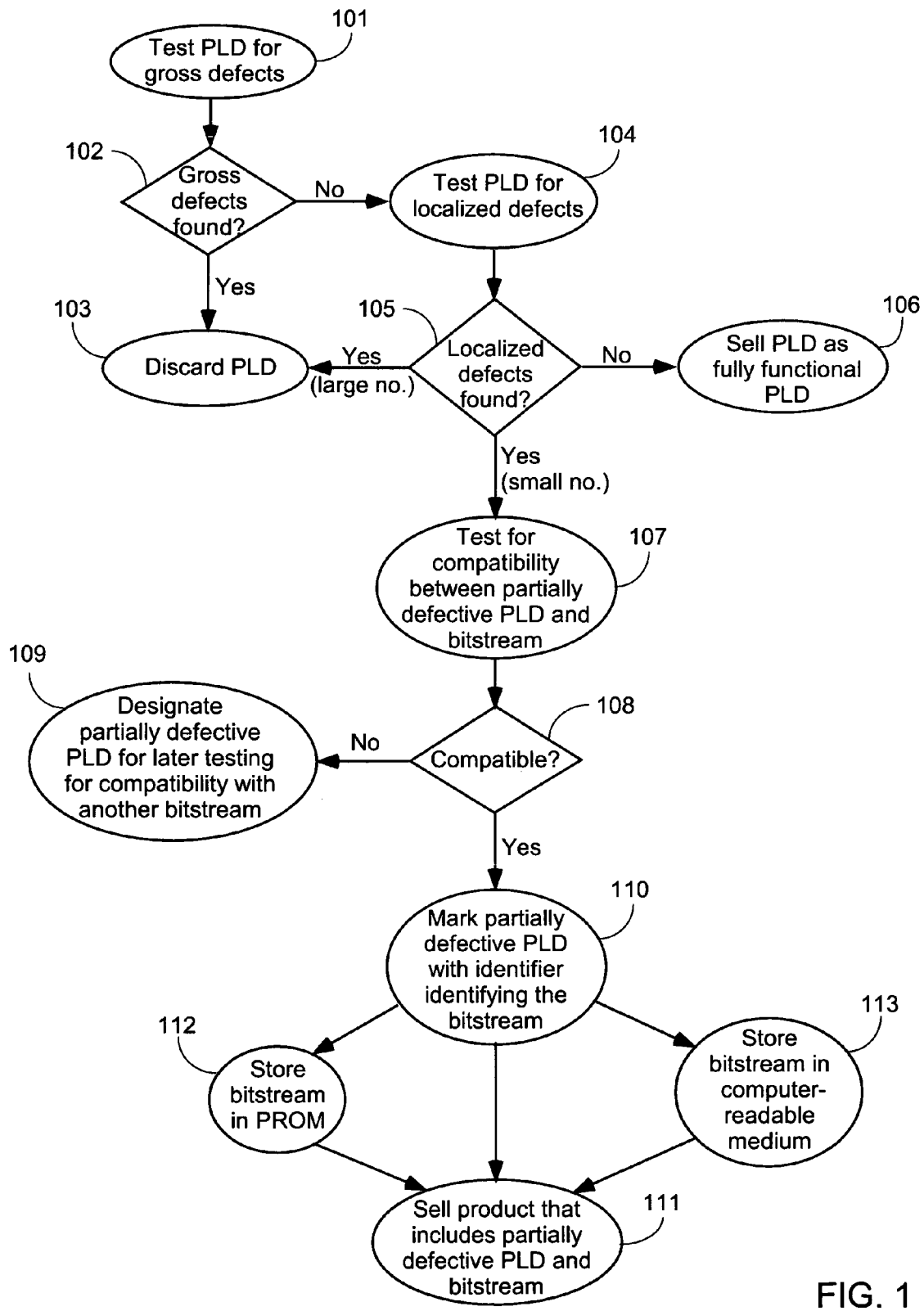
FIG. 1 illustrates the steps of an exemplary method of utilizing a partially defective PLD.

In the following description, numerous specific details are set forth to provide a more thorough understanding of the present invention. However, it will be apparent to one skilled in the art that the present invention can be practiced without these specific details.

FIG. 1 illustrates the steps of an exemplary method of utilizing a partially defective PLD, i.e., a PLD having one or more localized defects. The method illustrated in FIG. 1 can be divided into two parts, steps 101–106 and steps 107–113. Steps 101–106 describe a process by which partially defective PLDs can be identified. Steps 107–113 (of which some steps are optional, as described below) describe a process by which PLDs previously identified as partially defective PLDs are tested for compatibility with predefined configuration bitstreams.

Steps 101–106 can optionally be performed at a different time and by a different entity than steps 107–113. For example, steps 101–106 can be performed by a first entity (e.g., a PLD manufacturer), which can then dispose of the partially defective PLDs to a second entity (e.g., an intellectual property provider that has generated an application-specific configuration bitstream). The second entity can then perform those of steps 107–113 deemed necessary for production of an application-specific product that includes the partially defective PLD and the configuration bitstream.

In some embodiments, steps 101–105 are performed on unpackaged PLD die. Therefore, only those dice are packaged that can potentially be sold as either fully functional PLDs (i.e., dice passed to step 106) or as part of an application-specific product (i.e., dice passed to step 107). In some of these embodiments, steps 106–113 are performed on packaged PLDs.

As previously noted, steps 101–106 describe an exemplary process by which partially defective PLDs can be identified. In step 101, a PLD is tested for gross defects. Gross defects are defects that render a PLD unusable for any customer purpose. Examples of gross defects include powersupply shorts or opens, excessive leakage, and defective clock-management circuitry. In some embodiments, defects associated with input/output blocks (IOBs) are considered gross defects. Many suitable methods of testing ICs, including PLDs, are well known to those of skill in the art. Various exemplary tests for gross defects are described in chapter 14 of "Application-Specific Integrated Circuits," by Michael John Sebastian Smith (1997), which is incorporated herein by reference. If gross defects are found (decision 102), the PLD is discarded (step 103).

In step 104, if no gross defects were found, the PLD is tested for localized defects. In a PLD, localized defects can include, for example, defective configuration memory cells. One way of detecting defective configuration memory cells is to perform a "readback test". In a readback test, one or more configuration bitstreams are loaded into the configuration memory cells of the PLD and then read back out of the PLD. Each readback bitstream is compared to the corresponding bitstream that was loaded into the PLD. If unexplained differences appear, the differing configuration bits can be assumed to be associated with defective configuration memory cells.

If no localized defects are found (decision 105), further tests can optionally be performed, for example, to verify timing (optional step not shown). If the PLD passes all tests, the PLD can optionally be sold as a fully functional PLD (step 106). The testing and selling processes for fully functional PLDs are well known to those of skill in the art. In some embodiments, PLDs in which no localized defects are found are treated as if they include a small number of localized defects (i.e., they pass to step 107).

In some embodiments, if any number of localized defects are found the PLD is designated as a partially defective PLD and passes to step 107. However, in some embodiments, the number of localized defects is evaluated to determine whether or not the PLD is likely to be useful in an application-specific product. In other words, if the number of localized defects is large, the PLD is unlikely to prove compatible with an application-specific configuration bitstream. Therefore, the PLD is discarded (step 103). The number of localized defects considered "large" depends on the size of the PLD in question and the distribution of the defects. If only a few localized defects are found, the PLD is designated a partially defective PLD potentially suitable for use in producing application-specific products, and passes to step 107.

In step 107, a PLD previously designated as a partially defective PLD is tested for compatibility with a particular configuration bitstream. This testing can be performed in various ways. In some embodiments, the testing involves tests specific to the target design represented by the configuration bitstream. In these embodiments, the partially defective PLD is configured with the configuration bitstream, and design-specific tests are run on the configured PLD to verify the functionality of the target design.

In other embodiments, the compatibility tests are not specific to the target design. In these embodiments, it is first determined which resources of the PLD are utilized by the configuration bitstream. Then the PLD resources utilized by the configuration bitstream are testing using standard test patterns (or portions thereof) commonly used to test PLD resources. For example, the tests used can be a subset of the tests used to verify full functionality of the PLD.

Exemplary tests that can be used to test for compatibility between a partially defective PLD and a configuration bitstream have been described by Shekhar Bapat et al. in co-pending U.S. patent application Ser. No. 10/388,000, entitled "Application-Specific Methods Useful for Testing Look Up Tables in Programmable Logic Devices", of which the present application is a continuation-in-part, and which is incorporated herein by reference in its entirety.

If the partially defective PLD and the configuration bitstream are not found to be compatible (decision 108), the PLD can optionally be designated for later testing for compatibility with another bitstream (step 109). In some embodiments, when the PLD has proven to be incompatible with a designated number of configuration bitstreams (e.g., ten), the PLD is discarded.

On the other hand, if the partially defective PLD and the configuration bitstream are found to be compatible, the partially defective PLD can optionally be marked with an identifier that identifies the bitstream (step 110). For example, if the PLD is a packaged die, the package can be marked with an identifier (e.g., a text string) that identifies the bitstream, the target design, and/or the application for which the PLD can be successfully used.

In step 111, a product is sold that includes both the configuration bitstream and the partially defective PLD that has been identified as compatible with the configuration bitstream. The bitstream can be stored, for example, in a programmable read-only memory (PROM) (step 112), and the PROM can be sold with the PLD. In some embodiments, the PROM is an erasable PROM (EPROM). In some embodiments, the PROM is included as part of the PLD (e.g., fabricated on the same substrate as the PLD). In some embodiments, the PROM is a separate device, and the PROM and the PLD are sold as a chip set targeted to a specific application. In some embodiments, the PROM and the PLD are included in the same chip package, for example with the PROM and the PLD die-attached or assembled as a multi-chip module (MCM).

In some embodiments, the bitstream is stored in a computer-readable medium (step 113) and the medium is sold along with the PLD. In other embodiments, the PLD and the bitstream are sold as a single product, but the bitstream is separately supplied, e.g., over a wide area network such as the Internet, or by other means.

In some embodiments, a die is tested for compatibility with multiple configuration bitstreams, each bitstream implementing the same design. As long as one of the bitstreams proves to be compatible with the PLD, the PLD can be sold as a packaged product along with the compatible bitstream.

Those having skill in the relevant arts of the invention will now perceive various modifications and additions that can be made as a result of the disclosure herein. For example, the above text describes the circuits of the invention in the context of field programmable gate arrays (FPGAs). However, the methods of the invention can also be implemented using other PLDs, e.g., Complex Programmable Logic Devices (CPLDs), which are also programmable devices configured with a configuration bitstream.

Accordingly, all such modifications and additions are deemed to be within the scope of the invention, which is to be limited only by the appended claims and their equivalents.

What is claimed is:

1. A method of utilizing a partially defective programmable logic device (PLD), the method comprising:
   testing for compatibility between the partially defective PLD and a configuration bitstream, the testing for compatibility, comprising verifying functionality of a design using a design specific test on the partially defective PLD having the configuration bitstream; and marking the partially defective PLD with an identifier identifying the configuration bitstream as usable with the partially defective PLD if the partially defective PLD and the configuration bitstream are determined to be compatible.

2. The method of claim 1, further comprising:
storing the configuration bitstream in a programmable read-only memory (PROM); and
selling a product kit including a chip set that includes the partially defective PLD and the PROM.

3. The method of claim 1, wherein:
the partially defective PLD includes a programmable read-only memory (PROM); and
the method further comprises storing the configuration bitstream in the PROM.

4. The method of claim 1, further comprising storing the configuration bitstream in a computer-readable medium; and
selling a product kit including the partially defective PLD and the computer-readable medium.

5. The method of claim 1, further comprising:
designating, if the partially defective PLD and the configuration bitstream are not compatible, the partially defective PLD for later testing for compatibility with a different bitstream.

6. The method of claim 1, wherein the configuration bitstream represents a target design, and testing for compatibility between the partially defective PLD and the configuration bitstream comprises:
configuring the partially defective PLD with the configuration bitstream; and
testing the configured partially defective PLD to verify functionality of the target design.

7. The method of claim 1, wherein the testing for compatibility comprises:
configuring the PLD with a configuration bitstream;
reading back the configuration bitstream from the PLD; and
determining compatibility between the PLD and the configuration bitstream by comparing the configuration bitstream written to configure the PLD with the configuration bitstream as read back.

8. A method of utilizing a programmable logic device (PLD), the method comprising:
testing the PLD for gross defects;
discarding the PLD if gross defects are present;
testing the PLD for localized defects;
performing, if localized defects are detected, the following:
configuring the PLD with a configuration bitstream;
reading back the configuration bitstream from the PLD; and
testing for compatibility between the PLD and the configuration bitstream by comparing the configuration bitstream written to configure the PLD with the configuration bitstream as read back; and
selling, if the PLD and the configuration bitstream are compatible, a product that includes the PLD and the configuration bitstream.

9. The method of claim 8, further comprising, if localized defects are detected, storing the configuration bitstream in a programmable read-only memory (PROM), and wherein selling the product includes selling a chip set that includes the PLD and the PROM.

10. The method of claim 8, wherein:
the PLD includes a programmable read-only memory (PROM); and
the method further comprises storing the configuration bitstream in the PROM.

11. The method of claim 8, further comprising storing the configuration bitstream in a computer-readable medium, and wherein selling the product includes selling the PLD and the computer-readable medium as a single application-specific product.

12. The method of claim 8, further comprising marking the PLD with an identifier identifying the configuration bitstream.

13. The method of claim 8, further comprising:
designating, if the PLD and the configuration bitstream are not compatible, the PLD for later testing for compatibility with a different bitstream.

14. A method of utilizing a programmable logic device (PLD), the method comprising:
testing the PLD for gross defects;
discarding the PLD if gross defects are present;
testing the PLD for localized defects;
performing, if localized defects are detected, the following:
configuring the PLD with the configuration bitstream; and
testing the configured PLD to verify functionality of the target design; and
selling, if the PLD and the configuration bitstream are determined to be compatible, a product that includes the PLD with the configuration bitstream.

* * * * *